US012054672B2

(12) United States Patent
Takshi et al.

(10) Patent No.: US 12,054,672 B2
(45) Date of Patent: Aug. 6, 2024

(54) ELECTROCHEMICAL CELLS FOR HARVESTING AND STORING ENERGY AND DEVICES INCLUDING THE SAME

(71) Applicant: UNIVERSITY OF SOUTH FLORIDA, Tampa, FL (US)

(72) Inventors: Arash Takshi, Tampa, FL (US); Belqasem Aljafari, Riverview, FL (US); Manoj Ram, Palm Harbor, FL (US)

(73) Assignee: UNIVERSITY OF SOUTH FLORIDA, Tampa, FL (US)

( * ) Notice: Subject to any disclaimer, the term of this patent is extended or adjusted under 35 U.S.C. 154(b) by 0 days.

(21) Appl. No.: 18/314,089

(22) Filed: May 8, 2023

(65) Prior Publication Data

US 2023/0272269 A1    Aug. 31, 2023

Related U.S. Application Data

(63) Continuation of application No. 17/189,625, filed on Mar. 2, 2021, now Pat. No. 11,702,589.

(60) Provisional application No. 62/986,874, filed on Mar. 9, 2020.

(51) Int. Cl.
| | |
|---|---|
| C09K 9/02 | (2006.01) |
| G02F 1/01 | (2006.01) |
| G02F 1/23 | (2006.01) |
| H01G 11/56 | (2013.01) |
| H10K 30/00 | (2023.01) |

(52) U.S. Cl.
CPC ........ *C09K 9/02* (2013.01); *C09K 2211/1433* (2013.01); *H01G 11/56* (2013.01); *H10K 30/451* (2023.02)

(58) Field of Classification Search
CPC .. C09K 9/02; C09K 2211/1433; H01G 11/56; H10K 30/451
See application file for complete search history.

(56) References Cited

U.S. PATENT DOCUMENTS

| | | | | |
|---|---|---|---|---|
| 5,837,015 | A | * 11/1998 | Venugopal | ............ H01M 50/46 |
| | | | | 29/623.5 |
| 2001/0042682 | A1 | * 11/2001 | Weres | ................... C25B 11/093 |
| | | | | 427/126.3 |
| 2012/0068166 | A1 | * 3/2012 | Radu | .................... C07D 333/76 |
| | | | | 257/E51.024 |
| 2014/0113200 | A1 | * 4/2014 | Seymour | ............. H01M 4/0416 |
| | | | | 361/502 |

(Continued)

OTHER PUBLICATIONS

Soukaina Rami (Synthesis, Characterization, and Electrochemical Properties of Polyaniline Thin Films, Master thesis, Mar. 10, 2015 (Year: 2015) (Year: 2015).*

(Continued)

*Primary Examiner* — Bijan Ahvazi
(74) *Attorney, Agent, or Firm* — Quarles & Brady LLP; Yakov Sidorin

(57) ABSTRACT

Electrochemical cells that include composite gel positioned between the first electrode and second electrode, where the composite gel comprises an electrolyte, a polyaryl amine, and an oxidant. The utilized composite gels are easy to produce at a low-cost, which makes them suitable in a number of different applications electrochromic devices, supercapacitors, solar cells, and hybrid photoactive supercapacitors.

14 Claims, 8 Drawing Sheets

(56) References Cited

U.S. PATENT DOCUMENTS

| | | | |
|---|---|---|---|
| 2015/0144195 A1* | 5/2015 | Irwin | H01G 9/2059 136/265 |
| 2018/0145336 A1* | 5/2018 | Millard | H01M 8/188 |
| 2018/0248143 A1* | 8/2018 | Awaga | H10K 30/352 |
| 2019/0033625 A1* | 1/2019 | Ram | C09K 9/02 |

OTHER PUBLICATIONS

Salunkhe, A. B., et al. (2013). Polyvinyl alcohol functionalized cobalt ferrite nanoparticles for biomedical applications. Applied surface science, 264, 598-604.

Sharma, K., et al. (2019). Flexible supercapacitor based on three-dimensional cellulose/graphite/polyaniline composite. International Journal of Energy Research, 43(1), 604-611.

Singh, R. et al. (2017). Electrical and structural properties of ionic liquid doped polymer gel electrolyte for dual energy storage devices. International journal of hydrogen energy, 42(14602), e14607.

Skunik-Nuckowska, M., et al. (2013). Integration of solid-state dye-sensitized solar cell with metal oxide charge storage material into photoelectrochemical capacitor. Journal of Power Sources, 234, 91-99.

Song, E., et al. (2013). Conducting polyaniline nanowire and its applications in chemiresistive sensing. Nanomaterials, 3(3), 498-523.

Stejskal, J., et al. (2017). Polyaniline cryogels supported with poly (vinyl alcohol): soft and conducting. Macromolecules, 50(3), 972-978.

Tai, Q., et al. (2011). In situ prepared transparent polyaniline electrode and its application in bifacial dye-sensitized solar cells. Acs Nano, 5(5), 3795-3799.

Takshi, A., et al. (2015). Photoactive supercapacitors for solar energy harvesting and storage. Journal of Power Sources, 275, 621-626.

Tang, Z., et al. (2011). Preparation of PAA-g-CTAB/PANI polymer based gel-electrolyte and the application in quasi-solid-state dye-sensitized solar cells. Electrochimica acta, 58, 52-57.

Thakur, V. K., et al. (2012). Hybrid materials and polymer electrolytes for electrochromic device applications. Advanced materials, 24(30), 4071-4096.

Tokarsky, J., et al. (2014). The IR and Raman spectra of polyaniline adsorbed on the glass surface; comparison of experimental, empirical force field, and quantum chemical results. European polymer journal, 57, 47-57.

Trchova, M., et al. (2014). Raman spectroscopy of polyaniline and oligoaniline thin films. Electrochimica Acta, 122, 28-38.

Wang, K., et al. (2015). Chemically crosslinked hydrogel film leads to integrated flexible supercapacitors with superior performance. Advanced materials, 27(45), 7451-7457.

Wu, M., et al. (2016). A high-performance current collector-free flexible in-plane micro-supercapacitor based on a highly conductive reduced graphene oxide film. Journal of Materials Chemistry A, 4(41), 16213-16218.

Xu, J., et al. (2016). Integrated photo-supercapacitor based on PEDOT modified printable perovskite solar cell. Advanced Materials Technologies, 1(5), 1600074.

Yu, H., et al. (2011). Improvement of the performance for quasi-solid-state supercapacitor by using PVA—KOH—KI polymer gel electrolyte. Electrochimica Acta, 56(20), 6881-6886.

Yu, H., et al. (2012). A novel redox-mediated gel polymer electrolyte for high-performance supercapacitor. Journal of Power Sources, 198, 402-407.

Yu, M., et al. (2015). Aqueous lithium-iodine solar flow battery for the simultaneous conversion and storage of solar energy. Journal of the American Chemical Society, 137(26), 8332-8335.

Zeng, W., et al. (2014). Fiber-based wearable electronics: a review of materials, fabrication, devices, and applications. Advanced materials, 26(31), 5310-5336.

Zhong, J., et al. (2015). Improved energy density of quasi-solid-state supercapacitors using sandwich-type redox-active gel polymer electrolytes. Electrochimica Acta, 166, 150-156.

Soukaina Rami (Synthesis, Characterization, and Electrochemical Properties of Polyaniline Thin Films, Master thesis, Mar. 10, 2015 (Year: 2015).

Abdelmola, F. M., et al. (2017). Photoelectrochemical Cell Of Hybrid Regioregular Poly (3-Hexylthiophene-2, 5-Diyl) And Molybdenum Disulfide Film. Surface Review and Letters, 24(02), 1750026.

Ahmed, M., et al. (2015). A thin film approach for SiC-derived graphene as an on-chip electrode for supercapacitors. Nanotechnology, 26(43), 434005.

Albu, A. M., et al. (2016). Novel PVA proton conducting membranes doped with polyaniline generated by in-situ polymerization. Electrochimica Acta, 211, 911-917.

Aljafari, B., et al. (2019). Photo-electric properties of polypyrrole based gel electrolyte for hybrid photoactive supercapacitors. ECS Transactions, 92(9), 7.

Aljafari, B., et al. (2019). Polyvinyl alcohol-acid redox active gel electrolytes for electrical double-layer capacitor devices. Journal of Solid State Electrochemistry, 23(1), 125-133.

Alvi, F., et al. (2011). Electrochemical supercapacitors based on graphene-conducting polythiophenes nanocomposite. ECS Transactions, 35(34), 167.

Alvi, F., et al. (2011). Graphene-polyethylenedioxythiophene conducting polymer nanocomposite based supercapacitor. Electrochimica Acta, 56(25), 9406-9412.

Arico, AS. (2005) "Nanostructured Materials for Advanced Energy Conversion and Storage Devices." Nat. Mater. 4 366-377.

Armaroli, N., et al. (2007). The future of energy supply: challenges and opportunities. Angewandte Chemie International Edition, 46(1-2), 52-66.

Aziz, S. B., et al. (2018). A conceptual review on polymer electrolytes and ion transport models. Journal of Science: Advanced Materials and Devices, 3(1), 1-17.

Bajpai, A. K., et al. (2008). Preparation and characterization of electrically conductive composites of poly (vinyl alcohol)-g-poly (acrylic acid) hydrogels impregnated with polyaniline (PANI). Express Polymer Lett, 2, 26-39.

Bao, C., et al. (2011). Poly (vinyl alcohol) nanocomposites based on graphene and graphite oxide: a comparative investigation of property and mechanism. Journal of Materials Chemistry, 21(36), 13942-13950.

Bernard, M. C., et al. (1997). Raman spectroscopy for the study of polyaniline. Synthetic metals, 85(1-3), 1145-1146.

Blinova, N. V., et al. (2009). The polymerization of aniline at a solution-gelatin gel interface. European polymer journal, 45(3), 668-673.

Chu, S., et al. (2012). Opportunities and challenges for a sustainable energy future. Nature, 488(7411), 294-303.

Coates, J. (2006). Interpretation of Infrared Spectra, a Practical Approach. Encyclopedia of Analytical Chemistry: Applications, Theory and Instrumentation. 12, 10815-10837.

De Albuquerque, J.E. et al. (2004). Study of the interconversion of polyaniline oxidation states by optical absorption spectroscopy. Synthetic Metals, 146(1), 1-10.

Deka, M., et al. (2009). Effect of dedoped (insulating) polyaniline nanofibers on the ionic transport and interfacial stability of poly (vinylidene fluoride-hexafluoropropylene) based composite polymer electrolyte membranes. Journal of Membrane Science, 327(1-2), 188-194.

Furukawa, Y., et al. (1986). Vibrational spectra of polyaniline and its 15N-and 2H-substituted derivatives in as-polymerized, alkali-treated and reduced states. Synthetic Metals, 16(2), 189-198.

Furukawa, Y., et al. (1988). Vibrational spectra and structure of polyaniline. Macromolecules, 21(5), 1297-1305.

Gangopadhyay, R., et al. (2001). Polyaniline-poly (vinyl alcohol) conducting composite: material with easy processability and novel application potential. Synthetic Metals, 123(1), 21-31.

Gohil, J. M., et al. (2006). Studies on the crosslinking of poly (vinyl alcohol). Journal of polymer research, 13(2), 161-169.

(56) References Cited

OTHER PUBLICATIONS

Gong, J., et al. (2017). Review on dye-sensitized solar cells (DSSCs): Advanced techniques and research trends. Renewable and Sustainable Energy Reviews, 68, 234-246.

Graetzel, M., et al. (2012). Materials interface engineering for solution-processed photovoltaics. Nature, 488(7411), 304-312.

Honmute, S., et al. (2012). Studies on polyaniline-polyvinyl alcohol (PANI-PVA) interpenetrating polymer network (IPN) thin films. International Journal of Science Research, 1(2), 102-106.

Hsu, C. Y., et al. (2010). A dye-sensitized photo-supercapacitor based on PProDOT-Et2 thick films. Journal of Power Sources, 195(18), 6232-6238.

Hu, L., et al. (2009). Highly conductive paper for energy-storage devices. Proc. Natl. Acad. Sci. USA, 106, 21490-21494.

Huang, H., et al. (2016). Reinforced polyaniline/polyvinyl alcohol conducting hydrogel from a freezing-thawing method as self-supported electrode for supercapacitors. Journal of materials science, 51(18), 8728-8736.

Larcher, D., et al. (2015). Towards greener and more sustainable batteries for electrical energy storage. Nature chemistry, 7(1), 19-29.

Lechene, B. P., et al. (2017). Theoretical analysis and characterization of the energy conversion and storage efficiency of photo-supercapacitors. Solar Energy Materials and Solar Cells, 172, 202-212.

Li, H., et al. (2009). Theoretical and experimental specific capacitance of polyaniline in sulfuric acid. Journal of Power Sources, 190(2), 578-586.

Li, W., et al. (2016). Strong and Robust Polyaniline-Based Supramolecular Hydrogels for Flexible Supercapacitors. Angewandte Chemie (International ed. in English), 55(32), 9196-9201.

Liu, P., et al. (2012). A solar rechargeable battery based on polymeric charge storage electrodes. Electrochemistry communications, 16(1), 69-72.

Mansur, H. S., et al. (2008). FTIR spectroscopy characterization of poly (vinyl alcohol) hydrogel with different hydrolysis degree and chemically crosslinked with glutaraldehyde. Materials Science and Engineering: C, 28(4), 539-548.

Meng, C., et al. (2010). Highly flexible and all-solid-state paperlike polymer supercapacitors. Nano letters, 10(10), 4025-4031.

Mini, P. A., et al. (2013). Design and development of an integrated device consisting of an independent solar cell with electrical storage capacity. Progress in Photovoltaics: Research and Applications, 21(5), 1153-1157.

Miyasaka, T., et al. (Jun. 2012). Dye-sensitized photocapacitors fabricated with ionic liquid electrolytes for power generation and storage. In ECS Meeting Abstracts (No. 38, p. 2864). IOP Publishing.

Mo, Y., et al. (2019). Redox-active gel electrolyte combined with branched polyaniline nanofibers doped with ferrous ions for ultrahigh-performance flexible supercapacitors. Polymers, 11(8), 1357.

Mohtasebi, A., et al. (2016). Interfacial charge transfer between phenyl-capped aniline tetramer films and iron oxide surfaces. The Journal of Physical Chemistry C, 120(51), 29248-29263.

Nagai, H., et al. (2004). Energy-storable dye-sensitized solar cell with a polypyrrole electrode. Chemical communications, (8), 974-975.

Nath, B. C., et al. (2014). High performance polyvinyl alcohol/multi walled carbon nanotube/polyaniline hydrogel (PVA/MWCNT/PAni) based dye sensitized solar cells. Electrochimica Acta, 146, 106-111.

Ngai, K. S., et al. (2016). A review of polymer electrolytes: fundamental, approaches and applications. Ionics, 22(8), 1259-1279.

Patil, D. S., et al. (2011). Chemical synthesis of highly stable PVA/PANI films for supercapacitor application. Materials Chemistry and Physics, 128(3), 449-455.

Prosanov, I. Y., et al. (2010). Study of PVA thermal destruction by means of IR and Raman spectroscopy. Physics of the Solid State, 52(10), 2203-2206.

Rahimi, F. et al. Energy storage capability of the dye sensitized solar cells via utilization of highly porous carbon electrodes. Proceedings vol. 9937, Next Generation Technologies for Solar Energy Conversion VII; 99370T (2016).

Rahimi, F., et al. (Sep. 2016). Photoelectrochemical reaction in conducting polymers for solar energy harvesting and charge storage. In Next Generation Technologies for Solar Energy Conversion VII (vol. 9937, p. 99370U). International Society for Optics and Photonics.

Ram, M. K., et al. (2016). A new chromic (TouchChromic) thin film. Acta Materialia, 121, 325-330.

Ranka, P., et al. (2016). Characterizing the oxidation level of polyaniline (PANI) at the interface of PANI/TiO2 nanoparticles under white light illumination. Thin Solid Films, 615, 44-55.

Rose, A., et al. (2018). Electrochemical analysis of graphene oxide/polyaniline/polyvinyl alcohol composite nanofibers for supercapacitor applications. Applied surface science, 449, 551-557.

Saito, Y., et al. (2010). Energy-storable dye-sensitized solar cells with interdigitated nafion/polypyrrole—Pt comb-like electrodes. Chemistry letters, 39(5), 488-489.

\* cited by examiner

ELECTROCHEMICAL CELLS FOR HARVESTING AND STORING ENERGY AND DEVICES INCLUDING THE SAME

CROSS-REFERENCE TO RELATED APPLICATIONS

This application is a continuation from the U.S. patent application Ser. No. 17/189,625, which claims the benefit of and priority from the U.S. Provisional Patent Application No. 62/986,874, filed on Mar. 9, 2020. The disclosure of each of the above-identified patent applications is incorporated by reference herein.

RELATED ART

To endure the evolution of green energy sources, harvesting, storage, and delivering energy is paramount to limit the dependence on nonrenewable sources. Electrochemical devices are exemplary applications to achieve this demand and cope with the intermittent nature of renewable energy sources. Some examples of such devices are supercapacitors, dye sensitized solar cells (DSSCs), and electrochromic windows. However, there is a need for solar cells and other related devices to have the ability to store energy within the device.

SUMMARY OF THE INVENTION

In accordance with the purpose(s) of the present disclosure, as embodied and broadly described herein are electrochemical cells that include composite gel positioned between the first electrode and second electrode, wherein the composite gel comprises an electrolyte, a polyaryl amine, and oxidant. The composite gels described herein are easy to produce at a low-cost, which makes them suitable in a number of different applications electrochromic devices, supercapacitors, solar cells, and hybrid photoactive supercapacitors.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims. In addition, all optional and preferred features and modifications of the described embodiments are usable in all aspects of the disclosure taught herein. Furthermore, the individual features of the dependent claims, as well as all optional and preferred features and modifications of the described embodiments are combinable and interchangeable with one another.

BRIEF DESCRIPTION OF THE DRAWINGS

Many aspects of the present disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

Figures 1A, 1B, 1C, 1D, 1E, 1F:
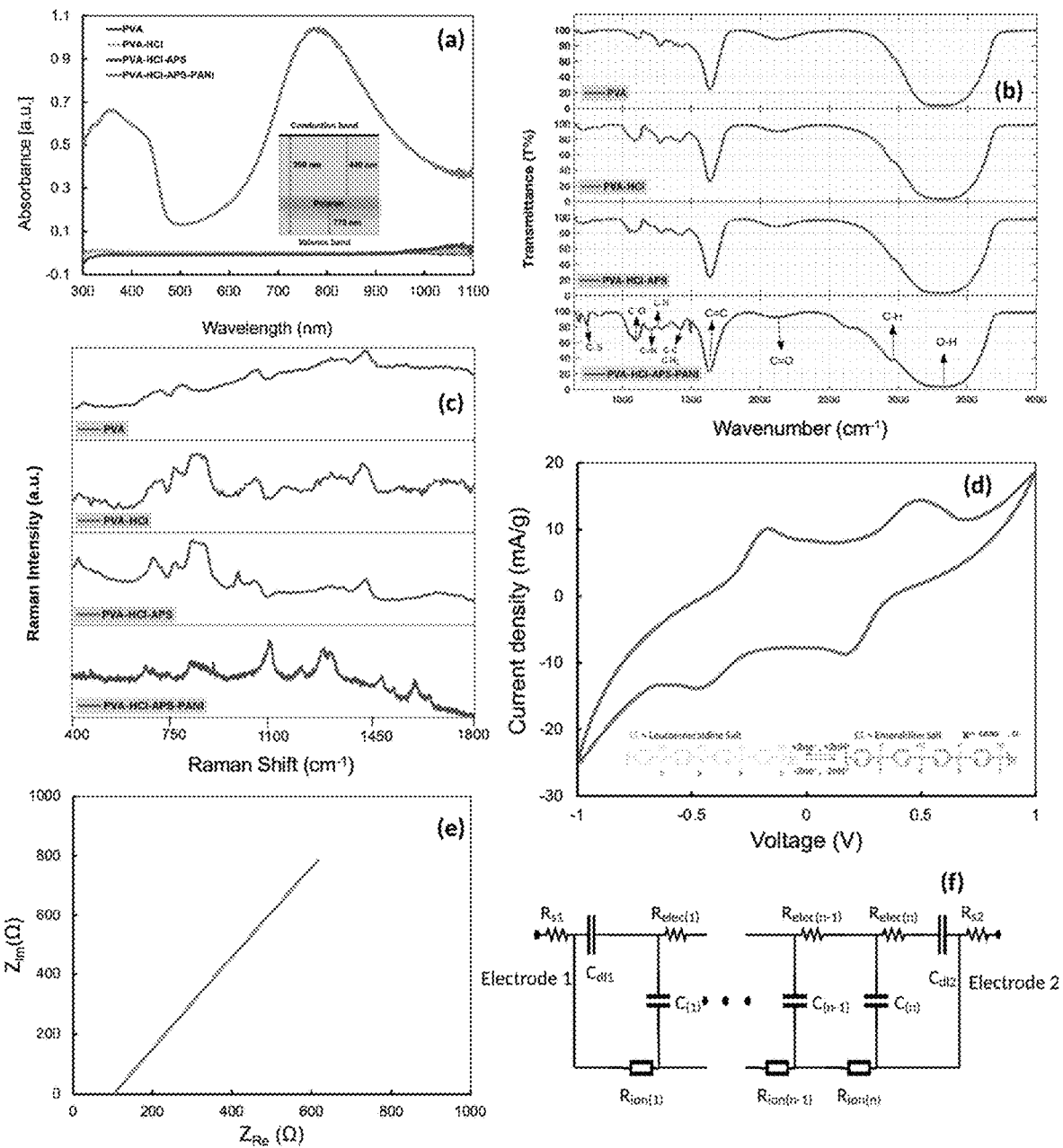
FIGS. 1A, 1B, 1C, 1D, 1E, and 1F show (a) a UV-vis absorption spectrum, (b) FTIR spectrum, and (c) Raman spectrum of the composite gel of PVA-HCI-APS-PANI, PVA, PVA-HC, and PVAHCI-APS. (d) CV result and (e) Nyquist plot from the EIS study of a thin composite gel layer sandwiched between two glassy carbon electrodes and (f) equivalent electrical circuit model of the complex impedance in the gel. The inset figure in plot (d) shows the transition of PANI from ES to LS form.

Additional advantages of the invention will be set forth in part in the description which follows, and in part will be obvious from the description, or can be learned by practice of the invention. The advantages of the invention will be realized and attained by means of the elements and combinations particularly pointed out in the appended claims. It is to be understood that both the foregoing general description and the following detailed description are exemplary and explanatory only and are not restrictive of the invention, as claimed.

DETAILED DESCRIPTION

Many modifications and other embodiments disclosed herein will come to mind to one skilled in the art to which the disclosed compositions and methods pertain having the benefit of the teachings presented in the foregoing descriptions and the associated drawings. Therefore, it is to be understood that the disclosures are not to be limited to the specific embodiments disclosed and that modifications and other embodiments are intended to be included within the scope of the appended claims. The skilled artisan will recognize many variants and adaptations of the aspects described herein. These variants and adaptations are intended to be included in the teachings of this disclosure and to be encompassed by the claims herein.

Although specific terms are employed herein, they are used in a generic and descriptive sense only and not for purposes of limitation.

As will be apparent to those of skill in the art upon reading this disclosure, each of the individual embodiments described and illustrated herein has discrete components and features which may be readily separated from or combined with the features of any of the other several embodiments without departing from the scope or spirit of the present disclosure.

Any recited method can be carried out in the order of events recited or in any other order that is logically possible. That is, unless otherwise expressly stated, it is in no way intended that any method or aspect set forth herein be construed as requiring that its steps be performed in a specific order. Accordingly, where a method claim does not specifically state in the claims or descriptions that the steps are to be limited to a specific order, it is no way intended that an order be inferred, in any respect. This holds for any possible non-express basis for interpretation, including matters of logic with respect to arrangement of steps or operational flow, plain meaning derived from grammatical organization or punctuation, or the number or type of aspects described in the specification.

All publications mentioned herein are incorporated herein by reference to disclose and describe the methods and/or materials in connection with which the publications are cited. The publications discussed herein are provided solely for their disclosure prior to the filing date of the present application. Nothing herein is to be construed as an admission that the present invention is not entitled to antedate such publication by virtue of prior invention. Further, the dates of publication provided herein can be different from the actual publication dates, which can require independent confirmation.

While aspects of the present disclosure can be described and claimed in a particular statutory class, such as the system statutory class, this is for convenience only and one of skill in the art will understand that each aspect of the present disclosure can be described and claimed in any statutory class.

It is also to be understood that the terminology used herein is for the purpose of describing particular aspects only and is not intended to be limiting. Unless defined otherwise, all technical and scientific terms used herein have the same meaning as commonly understood by one of ordinary skill in the art to which the disclosed compositions and methods belong. It will be further understood that terms, such as those defined in commonly used dictionaries, should be interpreted as having a meaning that is consistent with their meaning in the context of the specification and relevant art and should not be interpreted in an idealized or overly formal sense unless expressly defined herein.

Prior to describing the various aspects of the present disclosure, the following definitions are provided and should be used unless otherwise indicated. Additional terms may be defined elsewhere in the present disclosure.

Definitions

As used herein, "comprising" is to be interpreted as specifying the presence of the stated features, integers, steps, or components as referred to, but does not preclude the presence or addition of one or more features, integers, steps, or components, or groups thereof. Moreover, each of the terms "by", "comprising," "comprises", "comprised of," "including," "includes," "included," "involving," "involves," "involved," and "such as" are used in their open, non-limiting sense and may be used interchangeably. Further, the term "comprising" is intended to include examples and aspects encompassed by the terms "consisting essentially of" and "consisting of." Similarly, the term "consisting essentially of" is intended to include examples encompassed by the term "consisting of".

As used in the specification and the appended claims, the singular forms "a," "an" and "the" include plural referents unless the context clearly dictates otherwise. Thus, for example, reference to "a metal," "a catalyst," or "a product," include, but are not limited to, combinations or mixtures of two or more such metals, catalysts, or products, and the like.

It should be noted that ratios, concentrations, amounts, and other numerical data can be expressed herein in a range format. It will be further understood that the endpoints of each of the ranges are significant both in relation to the other endpoint, and independently of the other endpoint. It is also understood that there are a number of values disclosed herein, and that each value is also herein disclosed as "about" that particular value in addition to the value itself. For example, if the value "10" is disclosed, then "about 10" is also disclosed. Ranges can be expressed herein as from "about" one particular value, and/or to "about" another particular value. Similarly, when values are expressed as approximations, by use of the antecedent "about," it will be understood that the particular value forms a further aspect. For example, if the value "about 10" is disclosed, then "10" is also disclosed.

When a range is expressed, a further aspect includes from the one particular value and/or to the other particular value. For example, where the stated range includes one or both of the limits, ranges excluding either or both of those included limits are also included in the disclosure, e.g. the phrase "x to y" includes the range from 'x' to 'y' as well as the range greater than 'x' and less than 'y'. The range can also be expressed as an upper limit, e.g. 'about x, y, z, or less' and should be interpreted to include the specific ranges of 'about x', 'about y', and 'about z' as well as the ranges of 'less than x', less than y', and 'less than z'. Likewise, the phrase 'about x, y, z, or greater' should be interpreted to include the specific ranges of 'about x', 'about y', and 'about z' as well as the ranges of 'greater than x', greater than y', and 'greater than z'. In addition, the phrase "about 'x' to 'y'", where 'x' and 'y' are numerical values, includes "about 'x' to about 'y'".

It is to be understood that such a range format is used for convenience and brevity, and thus, should be interpreted in a flexible manner to include not only the numerical values explicitly recited as the limits of the range, but also to include all the individual numerical values or sub-ranges encompassed within that range as if each numerical value and sub-range is explicitly recited. To illustrate, a numerical range of "about 0.1% to 5%" should be interpreted to include not only the explicitly recited values of about 0.1% to about 5%, but also include individual values (e.g., about 1%, about 2%, about 3%, and about 4%) and the sub-ranges (e.g., about 0.5% to about 1.1%; about 5% to about 2.4%; about 0.5% to about 3.2%, and about 0.5% to about 4.4%, and other possible sub-ranges) within the indicated range.

As used herein, the terms "about," "approximate," "at or about," and "substantially" mean that the amount or value in question can be the exact value or a value that provides equivalent results or effects as recited in the claims or taught herein. That is, it is understood that amounts, sizes, formulations, parameters, and other quantities and characteristics are not and need not be exact, but may be approximate and/or larger or smaller, as desired, reflecting tolerances, conversion factors, rounding off, measurement error and the like, and other factors known to those of skill in the art such that equivalent results or effects are obtained. In some circumstances, the value that provides equivalent results or effects cannot be reasonably determined. In such cases, it is generally understood, as used herein, that "about" and "at or about" mean the nominal value indicated ±10% variation unless otherwise indicated or inferred. In general, an amount, size, formulation, parameter or other quantity or characteristic is "about," "approximate," or "at or about" whether or not expressly stated to be such. It is understood that where "about," "approximate," or "at or about" is used before a quantitative value, the parameter also includes the specific quantitative value itself, unless specifically stated otherwise.

As used herein, the terms "optional" or "optionally" means that the subsequently described event or circumstance can or cannot occur, and that the description includes instances where said event or circumstance occurs and instances where it does not.

As used herein, the term "admixing" is defined as mixing two or more components together so that there is no chemical reaction or physical interaction. The term "admixing" also includes the chemical reaction or physical interaction between the two or more components.

The term "alkyl group" as used herein is a branched or unbranched saturated hydrocarbon group of 1 to 24 carbon atoms, such as methyl, ethyl, n-propyl, isopropyl, n-butyl, isobutyl, t-butyl, pentyl, hexyl, heptyl, octyl, decyl, tetradecyl, hexadecyl, eicosyl, tetracosyl and the like. A "lower alkyl" group is an alkyl group containing from one to six carbon atoms.

The term "alkenyl group" is defined herein as a $C_2$-$C_{20}$ alkyl group possessing at least one C=C double bond. The term "alkynyl group" is defined herein as a $C_2$-$C_{20}$ alkyl group possessing at least one C—C triple bond.

The term "cycloalkyl group" as used herein is a $C_3$ to $C_8$ cyclic group. The cycloalkyl can be fully saturated or possess one or more degrees of unsaturation. Examples of cycloalkyl groups include, but are not limited to, cyclopropyl, cyclobutyl, cyclopentyl, cyclohexyl, and the like. The term "cycloalkyl" also includes a cycloalkyl group that has at least one heteroatom incorporated within the ring. Examples of heteroatoms include, but are not limited to, nitrogen, oxygen, sulfur, and phosphorus. The cycloalkyl group can be substituted or unsubstituted.

The term "alkoxy group" as used herein is represented by —OR, where R is an alkyl group, an alkenyl group, an alkynyl group, an aryl group, a cycloalkyl group, or an acyl group.

Electrochemical Cell Design

Figure 7A:
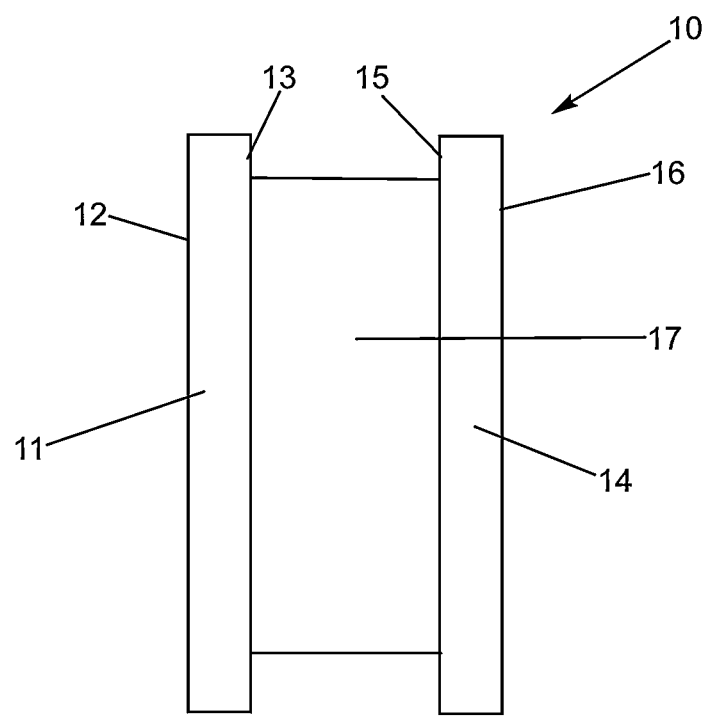
FIGS. 7A and 7B depict electrochemical cells described herein.

FIG. 7A schematically illustrates an example of an electrochemical cell described herein. Referring to FIG. 7A, electrochemical cell 10 generally includes a first electrode 11 having a first surface 12 and a second surface 13, a second electrode 14 having a first surface 15 and a second surface 16, and a composite gel 17 positioned between the first and second electrode. In this aspect, the composite gel 17 is in direct contact with the second surface of the first electrode and the first surface of the second electrode.

Figure 7B:
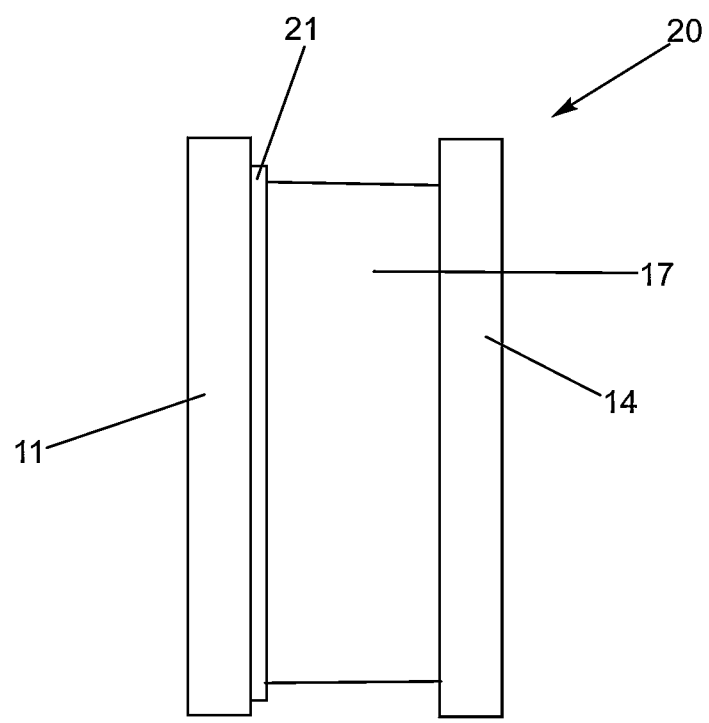

FIG. 7B depicts another aspect of the electrochemical cell. The electrochemical cell 20 has the first electrode 12 and second electrode 14, where a separator 21 is positioned between the composite gel 17 and the first electrode 12. In one aspect, the separator can be composed of any material that prevents short-circuiting of the electrodes. In one aspect, the separator is a non-electrically, porous conductive material composed of a material such as, for example, polypropylene glass, fiberglass mesh, or Parafilm. In one aspect, the separator has a thickness of about 10 μm to about 500 μm.

Depending upon the application of the electrochemical cells described herein, the first electrode and second electrode can be composed of the same material or different material. In one aspect, the first electrode comprises a transparent material that permits light to pass through the material. In another aspect, the first and/or second electrode comprises glass or fluorine-doped tin oxide glass. In another aspect, the first and/or second electrode comprises porous carbon. The Examples provide nonlimiting examples for producing porous carbon electrodes useful herein.

Figures 3A, 3B, 3C:
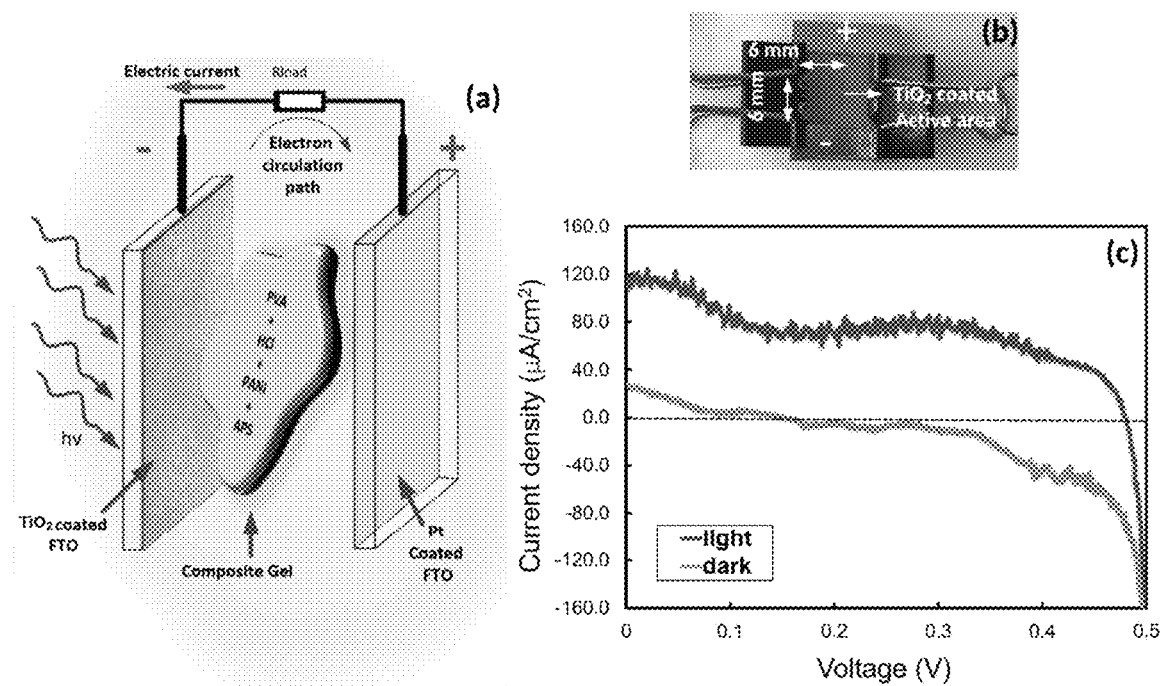
FIGS. 3A, 3B, and 3C show (a) a schematic diagram; (b) a picture of the fabricated electrochemical cell with the composite gel; and (c) J-V characteristics of the electrochemical cell device in dark and light.

In other aspects, the first and/or second electrode comprises glass or fluorine-doped tin oxide glass, where one surface of the first and/or second electrode is coated with materials such as, for example, $TiO_2$, ZnO, or platinum. This aspect is depicted in FIG. 3A, where $TiO_2$ and Pt are coated on the inner surface of each electrode (i.e., surfaces that are in contact with the composite gel).

The composite gel can be applied to the surface of the first or second electrode using techniques known in the art. In one aspect, the composite gel can be coated on the surface of the first or second electrode. The thickness of the composite gel can vary depending upon the application of the electrochemical cell. In one aspect, the composite gel has a thickness of from about 50 μm to about 500 μm, or about 50 μm, about 100 μm, about 150 μm, about 200 μm, about 250 μm, about 300 μm, about 350 μm, about 400 μm, about 450 μm, or about 500 μm, where any value can be a lower and upper endpoint of a range (e.g., about 200 μm to about 300 μm, etc.)

In certain aspects, a photosensitive dye can be applied to the surface of the first and/or second electrode prior to applying the composite gel on the electrode. The photosensitive dye can be applied to the surface of the electrode using techniques known in the art such as, for example, by chemical deposition or electrochemical deposition. Examples of photosensitive dyes useful herein include, but are not limited to, organic dyes, a porphine-based dyes, or a ruthenium-based dyes.

Composite Gel

The composite gel is composed of conducting polymer embedded in a cross-linked hydrogel with the ability of conducting both electronic and ionic charges. In one aspect, the composite gel comprises an electrolyte, a polyaryl amine, and an oxidant. Each component used to prepare the composite gels and methods for making the same are described below.

In one aspect, the electrolyte as used herein is the reaction product between a polymer comprising a plurality of groups that can react with an acid or base. In one aspect, the electrolyte is produced by reacting a hydrolysable polymer with an acid. Hydrolysable polymers useful herein include any polymers having a plurality of hydrolysable groups such that when the polymer is reacted with acid the polymer becomes conductive. In one aspect, the polyol comprises polyvinyl alcohol. The hydrolysable polymer is poly(vinyl alcohol) (PVA), poly (vinyl acetate, poly (vinyl alcohol co-vinyl acetate), poly (methyl methacrylate, poly (vinyl alcohol-co-ethylene ethylene), poly (vinyl butyral-co-vinyl alcohol-co-vinyl acetate), polyvinyl butyral, polyvinyl chloride, and any combination thereof. In another aspect, the hydrolysable polymer is erythritol, hydrogenated starch hydrolysates, isomalt, lactitol, maltitol, mannitol, sorbitol, xylitol, and any combination thereof.

In one aspect, the hydrolysable polymer has a molecular weight of from about 20,000 Da to about 300,000 Da, or about 20,000 Da, about 50,000 Da, about 100,000 Da, about 150,000 Da, about 200,000 Da, about 250,000 Da, or about 300,000 Da, where any value can be a lower and upper endpoint of a range (e.g., about 50,000 Da to about 100,000 Da). In another aspect, the hydrolysable polymer is poly(vinyl alcohol) (PVA) having a molecular weight of from about 20,000 Da to about 300,000 Da, or about 20,000 Da, about 50,000 Da, about 100,000 Da, about 150,000 Da, about 200,000 Da, about 250,000 Da, or about 300,000 Da, where any value can be a lower and upper endpoint of a range (e.g., about 50,000 Da to about 100,000 Da).

The composite gel includes a conductive polymer in the form of a polyaryl amine. The polyaryl amine is produced by the polymerization of an aryl amine. An aryl amine as defined herein as an aryl group with an amine group covalently bonded to the aryl group. As used herein, "aryl group" is any carbon-based aromatic group including, but not limited to, benzene, naphthalene, etc. The term "aryl group" also includes "heteroaryl group," which is defined as an aryl group that has at least one heteroatom incorporated within the ring of the aromatic ring. Examples of heteroatoms include, but are not limited to, nitrogen, oxygen, sulfur, and phosphorus. In one aspect, the heteroaryl group is imidazole. The aryl group can be substituted or unsubstituted. The aryl group can be substituted with one or more groups including, but not limited to, alkyl, alkynyl, alkenyl, aryl, halide, nitro, amino, ester, ketone, aldehyde, hydroxy, carboxylic acid, or alkoxy. In one aspect, the aryl amine is aniline.

The aryl amine also includes aromatic compounds where the amine group is part of the aromatic ring. An example of this includes pyrrole, where the NH group is part of the five-membered ring.

In one aspect, the polyaryl amine is a homopolymer of aniline or a substituted aniline (e.g., alkyl, alkynyl, alkenyl, aryl, halide, nitro, amino, ester, ketone, aldehyde, hydroxy, carboxylic acid, or alkoxy). In another aspect, the polyaryl amine is a copolymer derived from two or more different aryl amines. In another aspect, the polyaryl amine is a copolymer of aniline and a substituted aniline. In another aspect, the polyaryl amine is polyaniline, poly(o-anisidine), poly(o-toluidine), poly(o-ethoxyaniline), poly(o-methoxyaniline), copolymer poly(aniline-o-anisidine), copolymer poly(aniline-o-toluidine), copolymer poly(aniline-o-ethoxyaniline), poly(N-methyl aniline), sulfonated polyaniline, poly(o-phenylenediamine), or any combination thereof.

The aryl group can be a fused aryl group consisting entirely of carbon atoms or, in other aspects, can include one or more heteroatoms (e.g., oxygen nitrogen, sulfur, or any combination thereof). In one aspect, the fused aryl group has from 2 to 10 fused aromatic groups, or 2, 3, 4, 5, 6, 7, 8, 9, or 10 aromatic groups, where any value can be a lower and upper end-point of a ranger (e.g., 2 to 8, 3 to 5, etc.). In one aspect, the fused aryl group includes naphthalene, anthracene, acenaphthene, acenaphthylene, fluorene, phenalene, phenanthrene, benzo[a]anthracene, benzo[a]fluorine, benzo[c]phenanthrene, chrysene, fluoranthene, tetracene, anthanthrene, benzopyrene, pyrene, benzo[a]pyrene, benzo[e]pyrene, benzo[b]fluoranthene, benzo[j]fluoranthene, benzo[k]fluoranthene, corannulene, coronene, dicoronylene, diindenoperylene, helicene, heptacene, hexacene, kekulene, ovalene, pentacene, perylene, picene, or tetraphenylenepentacene.

In one aspect, the polyaryl amine is a homopolymer of aniline or a substituted aniline (e.g., alkyl, alkynyl, alkenyl, aryl, halide, nitro, amino, ester, ketone, aldehyde, hydroxy, carboxylic acid, or alkoxy). In another aspect, the polyaryl amine is a copolymer derived from two or more different aryl amines. In another aspect, the polyaryl amine is a copolymer of aniline and a substituted aniline. In another aspect, the polyaryl amine is polyaniline, poly(o-anisidine), poly(o-toluidine), poly(o-ethoxyaniline), poly(o-methoxyaniline), copolymer poly(aniline-o-anisidine), copolymer poly(aniline-o-toluidine), copolymer poly(aniline-o-ethoxyaniline), poly(N-methyl aniline), sulfonated polyaniline, poly(o-phenylenediamine), or any combination thereof.

The amine group in the aryl amine monomer can be unsubstituted or substituted with groups such as, for example, an alkyl group.

In one aspect, the composite gel is produced by admixing a hydrolysable polymer, an aryl amine, an acid, and an oxidant. In one aspect, the composite gel is produced by
a. admixing the hydrolysable polymer and acid to produce a first admixture;
b. admixing the oxidant with the first admixture to produce a second admixture; and
c. admixing the aryl amine with the second admixture to produce the composite gel.

In one aspect, the hydrolysable polymer and acid can be admixed in varying concentrations. In one aspect, the acid is HCl, $H_2SO_4$, $H_3PO_4$, or any combination thereof. In other aspect, the acid can be a weak acid such as, for example, citric acid. The acid can be a single acid or a mixture of acetic acid, propionic acid, hydrochloric acid, hydrofluoric acid, phosphoric acid, sulfuric acid, formic acid, benzoic acid, hydrofluoric acid, nitric acid, phosphoric acid, sulfuric acid, tungstosilicic acid hydrate, hydriodic acid, carboxylic acids, dicarboxylic, tricarboxylic, oxalic acid, hexacarboxylic acid, citric acid, p-camphor sulfonic, $FeCl_3$ and polyacrylic, tartaric acid, oxalic acid, or any combination thereof.

In one aspect, the first admixture is produced by admixing 1 g to 10 g of hydrolysable polymer (e.g., polyvinyl alcohol) in 100 mL of HCl, where the concentration of HCl is from about 0.5 M to about 1.5 M. In one aspect, the first admixture is heated at a temperature of from about 50° C. to about 100° C. for 1 hour to 12 hours.

An oxidant is next added to the first admixture to produce a second admixture. A single oxidant or mixtures of two or more oxidants can be used. Examples of oxidants useful here include, but are not limited to, ammonium persulfate, ferric chloride, aluminum nitrate, ammonium dichromate, ammonium peroxydisulphate, barium nitrate, bismuth nitrate, calcium hypoperchlorate, copper (II) nitrate, cupric nitrate, ferric nitrate, hydrogen peroxide, lithium hydroxide monohydrate, magnesium nitrate, magnesium perchlorate, potassium chlorate, potassium dichromate, potassium permanganate, sodium hypochlorite, sodium periodate, zinc nitrate hydrate, nitric acid, sulfuric acid, perchloric acid, ammonium nitrate, silver nitrate, benzoyl peroxide, tetranitromethane, sodium perchlorate, potassium perchlorate, potassium permanganate, potassium persulfate, sodium nitrate, potassium chromate, or any combination thereof. In one aspect, the oxidant is added to the first admixture produced by admixing 1 g to 10 g of hydrolysable polymer (e.g., polyvinyl alcohol) in 100 mL of HCl, where the concentration of HCl is from about 0.5 M to about 1.5 M.

Once the second admixture is produced, the aryl amine is added to produce the aryl amine in situ. In one aspect, the aryl amine is aniline, where polyaniline is produced in situ.

In another aspect, the aryl amine is pyrrole, where polypyrrole is produced in situ. The Examples provide nonlimiting procedures for making the composite gels useful herein. Here, the polyaryl amine is homogeneously dispersed throughout the composite gel.

In certain aspects, a photosensitive dye can be incorporated in the composite gels described herein. For example, the photosensitive dye can be included in the first or second admixture described above. Examples of photosensitive dyes useful herein include, but are not limited to, an organic dye, a porphine-based dye, or a ruthenium-based dye.

The composite gels described herein are easy to produce at a low-cost, which makes them suitable in a number of different applications electrochromic devices, supercapacitors, solar cells, and hybrid photoactive supercapacitors. For example, hybrid solar cell-supercapacitors can be used in self-powered wireless sensors, particularly for structural health monitoring systems (SHMS). In an SHMS, a large number (a few thousand) of wireless sensors are installed over the body of a structure (e.g., bridges or buildings) to measure and transmit vibration, temperature, and corrosion rate. As a practical solution, the sensors can be designed to harvest solar energy. Considering the number of required sensors for a single structure, a compact and low-cost device with the dual functions of energy harvesting and storage can dramatically reduce the sensors cost and provide a practical solution for constant monitoring of the structure's health. The solar cells with the composite gels described herein provide a solution to this long felt need. Additionally, low-cost and more efficient devices can be designed and fabricated by customizing the composite gels described herein by adding other elements such as dyes or nanoparticles.

In one aspect, the electrochemical cells described herein can be used as a solar cell for harvesting and storing solar energy. In one aspect, the first electrode is a working electrode and the second electrode functions as the counter electrode, wherein the composite gel is positioned between the electrodes. In one aspect, the working electrode is a transparent electrode. In one aspect, the working electrode is a layer of glass that is coated with a conductive coating such as for example, indium tin oxide (ITO) or fluorine-doped tin oxide (FTO). In some aspects, the counter electrode includes a layer of highly porous activated carbon paper.

Aspects

Aspect 1. An electrochemical cell comprising
a. a first electrode having a first surface and second surface;
b. a second electrode having a first surface and second surface; and
c. a composite gel positioned between the first electrode and the second electrode, wherein the composite gel comprises a polyaryl amine, an electrolyte, and an oxidant.

Aspect 2. The electrochemical cell of Aspect 1, wherein the electrolyte comprises the reaction product between a hydrolysable polymer and an acid.

Aspect 3. The electrochemical cell of Aspect 2, wherein the hydrolysable polymer comprises poly(vinyl alcohol) (PVA), poly (vinyl acetate, poly (vinyl alcohol co-vinyl acetate), poly (methyl methacrylate, poly (vinyl alcohol-co-ethylene ethylene), poly (vinyl butyral-co-vinyl alcohol-co-vinyl acetate), polyvinyl butyral, polyvinyl chloride, and any combination thereof.

Aspect 4. The electrochemical cell of Aspect 2, wherein the hydrolysable polymer has a molecular weight of from about 20,000 Da to about 300,000 Da.

Aspect 5. The electrochemical cell of Aspect 2, wherein the hydrolysable polymer is poly(vinyl alcohol) a molecular weight of from about 20,000 Da to about 300,000 Da.

Aspect 6. The electrochemical cell in any one of Aspects 1 to 5, wherein the polyaryl amine is a homopolymer of aniline or a substituted aniline.

Aspect 7. The electrochemical cell in any one of Aspects 1 to 5, wherein the polyaryl amine is a copolymer derived from two or more different aryl amines.

Aspect 8. The electrochemical cell in any one of Aspects 1 to 5, wherein the polyaryl amine is a copolymer of aniline and a substituted aniline.

Aspect 9. The electrochemical cell in any one of Aspects 1 to 5, wherein polyaryl amine comprises polyaniline, poly(o-anisidine), poly(o-toluidine), poly(o-ethoxyaniline), poly(o-methoxyaniline), copolymer poly(aniline-o-anisidine), copolymer poly(aniline-o-toluidine), copolymer poly(aniline-o-ethoxyaniline), poly(N-methyl aniline), sulfonated polyaniline, poly(o-phenylenediamine), polypyrrole, or any combination thereof.

Aspect 10. The electrochemical cell in any one of Aspects 1 to 9, wherein the composite gel is produced by admixing a hydrolysable polymer, an aryl amine, an acid, and an oxidant.

Aspect 11. The electrochemical cell in any one of Aspects 1 to 10, wherein the composite gel is produced by
a. admixing the hydrolysable polymer and acid to produce a first admixture;
b. admixing the oxidant with the first admixture to produce a second admixture; and
c. admixing the aryl amine with the second admixture.

Aspect 12. The electrochemical cell of Aspect 10 or 11, wherein the hydrolysable polymer comprises polyvinyl alcohol.

Aspect 13. The electrochemical cell in any one of Aspects 10 to 12, wherein the aryl amine comprises aniline or a substituted aniline.

Aspect 14. The electrochemical cell in any one of Aspects 10 to 13, wherein the acid comprises acetic acid, propionic acid, hydrochloric acid, hydrofluoric acid, phosphoric acid, sulfuric acid, formic acid, benzoic acid, hydrofluoric acid, nitric acid, phosphoric acid, sulfuric acid, tungstosilicic acid hydrate, hydriodic acid, carboxylic acids, dicarboxylic, tricarboxylic, oxalic acid, hexacarboxylic acid, citric acid, p-camphor sulfonic, $FeCl_3$ and polyacrylic, tartaric acid, oxalic acid, or any combination thereof.

Aspect 15. The electrochemical cell in any one of Aspects 10 to 14, wherein the oxidant comprises ammonium persulfate, ferric chloride, aluminum nitrate, ammonium dichromate, ammonium peroxydisulphate, barium nitrate, bismuth nitrate, calcium hypoperchlorate, copper (II) nitrate, cupric nitrate, ferric nitrate, hydrogen peroxide, lithium hydroxide monohydrate, magnesium nitrate, magnesium perchlorate, potassium chlorate, potassium dichromate, potassium permanganate, sodium hypochlorite, sodium periodate, zinc nitrate hydrate, nitric acid, sulfuric acid, perchloric acid, ammonium nitrate, silver nitrate, benzoyl peroxide, tetranitromethane, sodium perchlorate, potassium perchlorate, potassium permanganate, potassium persulfate, sodium nitrate, potassium chromate, or any combination thereof.

Aspect 16. The electrochemical cell in any one of Aspects 10 to 15, wherein the composite gel further comprises photosensitive dye.

Aspect 17. The electrochemical cell of Aspect 16, wherein the photosensitive dye comprises an organic dye, a porphine-based dye, or a ruthenium-based dye.

Aspect 18. The electrochemical cell in any one of Aspects 1 to 17, wherein the composite gel has a thickness of from about 50 μm to about 500 μm.

Aspect 19. The electrochemical cell in any one of Aspects 1 to 18, wherein the composite gel has a specific capacitance of from about 300 mF/g to about 700 mF/g.

Aspect 20. The electrochemical cell in any one of Aspects 1 to 19, wherein the first electrode and second electrode are composed of the same material.

Aspect 21. The electrochemical cell in any one of Aspects 1 to 20, wherein the first electrode and second electrode are composed of the same material.

Aspect 22. The electrochemical cell in any one of Aspects 1 to 20, wherein the first electrode comprises a transparent material.

Aspect 23. The electrochemical cell in any one of Aspects 1 to 20, wherein the first electrode comprises glass or fluorine-doped tin oxide glass.

Aspect 24. The electrochemical cell in any one of Aspects 1 to 20, wherein the second electrode comprises porous carbon.

Aspect 25. The electrochemical cell in any one of Aspects 1 to 20, wherein the first electrode comprises porous carbon, platinum, or $TiO_2$, and the second electrode comprises porous carbon, platinum, or $TiO_2$.

Aspect 26. The electrochemical cell in any one of Aspects 1 to 25, wherein the first electrode comprises fluorine-doped tin oxide glass with a coating comprising $TiO_2$ or platinum on the first surface, the second electrode comprises fluorine-doped tin oxide glass with a coating comprising $TiO_2$ or platinum on the first surface, or both the first electrode and second electrode comprises fluorine-doped tin oxide glass with a coating comprising $TiO_2$ or platinum on the first surface.

Aspect 27. The electrochemical cell in any one of Aspects 1 to 26, wherein the electrochemical cell further comprises a separator adjacent to the first surface of the first electrode, a separator adjacent to the first surface of the second electrode, or a separator adjacent to the first surface of the first electrode and second electrode.

Aspect 28. A device comprising the electrochemical cell in any one of Aspects 1 to 27.

Aspect 29. The device of Aspect 28, wherein the device comprises an electrochromic device, a supercapacitor, a solar cell, or a hybrid photoactive supercapacitor.

Now having described the aspects of the present disclosure, in general, the following Examples describe some additional aspects of the present disclosure. While aspects of the present disclosure are described in connection with the following examples and the corresponding text and figures, there is no intent to limit aspects of the present disclosure to this description. On the contrary, the intent is to cover all alternatives, modifications, and equivalents included within the spirit and scope of the present disclosure.

EXAMPLES

The following examples are put forth so as to provide those of ordinary skill in the art with a complete disclosure and description of how the compounds, compositions, articles, devices and/or methods claimed herein are made and evaluated, and are intended to be purely exemplary of the disclosure and are not intended to limit the scope of what the inventors regard as their disclosure. Efforts have been made to ensure accuracy with respect to numbers (e.g., amounts, temperature, etc.), but some errors and deviations should be accounted for. Unless indicated otherwise, parts are parts by weight, temperature is in ° C. or is at ambient temperature, and pressure is at or near atmospheric.

EXPERIMENTAL SECTION

Materials. All chemical materials, including multi-walled carbon nanotubes (MWCNTs), sodium dodecyl benzenesulfonate (SDBS), polyvinyl alcohol (PVA), hydrochloric acid (HCl), aniline, and ammonium persulfate (APS) were purchased from Sigma-Aldrich and used as received without any further purification. FTO electrodes were purchased from Huanyu Instrument (China) with 1.66 mm thickness and 12 Ω·cm-2 sheet resistance. Pt-coated FTO conductive electrodes (2.0 cm×2.0 cm) and $TiO_2$ coated FTO electrodes (2.0 cm×2.0 cm with 6 mm×6 mm active area–$TiO_2$ coated part) were purchased from Solaronix. Two pieces of glassy carbons (25×25×3 mm3) were purchased from SPI Supplies. The paper substrates used for making the electrodes were standard lettersize copy paper from Office Depot.

Electrodes Preparation. Porous carbon electrodes were made using inhouse prepared MWCNT-based ink on the copy papers. Following the instruction developed by Hu et al., the ink was made by first mixing 300 mg of CNTs and 150 mg of SDBS in 30 mL of deionized (DI) water. Then, the solution was sonicated for 30 min using a probe sonicator at 30 W and 40 J average power and energy, respectively. The conductive ink solution was used to make the electrodes by drop casting 1 mL on the surface of a piece of a paper (4.0 cm×7.0 cm) and drying in a vacuum oven for 30 min at 120° C. The process was repeated three times to make the electrodes conductive enough. The conductive paper sheet was cut in rectangular pieces with the surface area of 4.0 cm×0.8 cm or 4.0 cm×0.6 cm, as electrodes for supercapacitors and photoactive supercapacitor devices. The thickness of the CNTs based electrodes was 150 μm. Additionally, the conductivity of the electrodes was measured to be 98 Ω·cm$^{-1}$ using a custom made four-probe setup connected to a Keithley (2602) sourcemeter unit. Before using, FTO, Pt, FTO-$TiO_2$ and glassy carbon electrodes were cleaned by rinsing with DI water, sonicating in DI water for 5 min, and sonicating in methanol and then in ethanol each for 5 min. The cleaned electrodes were dried under hot air flow.

Composite Gel Preparation. The gel composite was synthesized following a recipe from other publications. First, PVA-HCl gel electrolyte was made by dissolving 5 g of PVA in 100 mL of 1 M HCl in a beaker. Then, the solution was stirred continuously and heated at 75° C. for 6 hrs at a speed of 400 rpm. After that, 30 ml solution of 0.1 M APS in 1 M HCl was added to the PVA-HCl solution at room temperature and stirred for 30 min at 600 rpm. At last, the composite gel was made by adding 3 ml of aniline to the PVA-HCl-APS at room temperature and stirred for 12 hrs. The composite gel polymer electrolyte was kept in a beaker (covered by a piece of Parafilm) at room temperature for at least a week before fabrication of the devices.

Device Fabrication. Devices were made by coating the entire surface of one of the electrodes with the composite gel, putting one layer of a fiberglass mesh (mesh thickness of 270 μm) or a Parafilm frame (130 μm thick) as separator, and putting the second electrode on the mesh and pressing them together with binder clips. Mesh separators were used for the device with the glassy carbon electrodes and the supercapacitor (CNT based electrodes). In the supercapacitor, the gel covered only 8 mm×8 mm of each electrode. Frames were cut from a Parafilm and used between the two electrodes in the electrochemical cell. The effective area covered by the gel in the electrochemical cell and the hybrid device was only 6 mm×6 mm (i.e., TiO$_2$ coated area on FTO). The gel covered area in the electrochromic device was 2.0 cm×1.5 cm.

Electrical and Electrochemical Measurements. VersaS-TAT 4 potentiostat with two-terminals configuration was used to measure the electrochemical and electrical tests, including CV, EIS, galvanostatic method, open circuit voltage, and short circuit current all in the two-probe configuration. All CVs were conducted at 50 mV·s$^{-1}$ scan rate. Multiple cycles were tested, and the last cycle of each experiment is reported in this work, except for the device with the glassy carbon electrodes that both the first and last cycle data is reported. All EIS studies were done at 0.0 V DC bias with an AC voltage amplitude of 20 mV for a frequency range of 0.1 Hz to 10 kHz. All the electrochemical measurements were carried out at room temperature. More specifically, the measurements for the supercapacitor and electrochromic devices were performed at ambient light in the lab. However, the hybrid photoactive supercapacitor and the electrochemical cell were placed in a dark box connected via an optical fiber to a solar simulator (RST, Radiant Source Technology) with an output power intensity of 80 mW·cm-2, which was equipped with an internal AM 1.0 optical filter. The experimental setup, including the dark box and the shutter mechanism, was designed to eliminate the effect of ambient light in the experiment. UV-Vis spectra and the transmittance data were recorded by a Thermo Scientific Evolution 201/220 UV-Visible Spectrophotometer. FTIR and Raman analysis were done by using PerkinElmer Spectrum 100 FT-IR and LabRAM HR Evolution, respectively.

Results and Discussion

The composite gel material was synthesized by first mixing PVA and hydrochloric acid (HCl) in water. In two steps, ammonium persulfate (APS) and monomer 'aniline' were added. APS and HCl reacted with aniline to produce PANI which was uniformly distributed in the PVA gel electrolyte. Chemically salt (ES) which is naturally green in color.

The optical absorption of the composite gel with PANI was studied and compared with the gels made from only PVA, PVAHCl, and PVA-HCl-APS. As shown in FIG. 1A, the gels without PANI were all transparent, but the absorption spectrum of the gel containing PANI confirmed the formation of the ES form of the polymer. The relatively broad absorption peak around 775 nm corresponds to the energy gap between the valence and polaron bands, and the peak at 350 nm is attributed to the transition from the valence band to the conduction band. Also, the shoulder at 440 nm is ascribed to the polaron to the conduction band transition, as shown in inset FIG. 1.a. The FTIR study was done to learn about the interaction of the PVA polymer matrix with APS and PANI. After normalization in the range of 650-4000 cm-1, the FTIR spectra (FIG. 1B) showed several transmittance peaks for PVA, PVA-HCl, PVA-HCl-APS, and PVA-HCl-APSPANI. The wide absorption at the wavenumber from 3700-3000 cm-1 is due to the symmetry of the stretching vibration of hydroxyl in PVA. Also, NH stretching vibration of the —C6H4NHC6H4- groups of PANI is present in this region.[26] The band at 2950-2660 cm$^{-1}$ is related to C—H stretching in the alkyl group.

The above broad band nature is extended up to nearly 2500 cm$^{-1}$ in presence of PANI. In the wavenumber range, 2950-2600 cm$^{-1}$ only one shoulder was observed in the FTIR spectrum of PVA while in presence of PANI, two shoulders appeared in this region with relatively high prominent feature. These well-defined shoulders at around 2950 and 2637 cm-1 are possibly due to the strong H-bonding of hydroxyl group of PVA with PANI in addition to the stretching vibrations related to C—H. To understand the interaction of PVA with PANI during the reaction progress, the band at around 1000-1150 cm$^{-1}$ of PVA should be precisely noted in presence of acid, APS and PANI. The band at 1100 cm$^{-1}$ may be attributed to O—H deformation and C—O stretching vibration of secondary alcohol of PVA in PVA as well as in PVA+HCl. In the presence of APS this band apparently splits, and a new band appears at around 1050 cm$^{-1}$ which is possibly due to the start of oxidation of PVA. Intensity of this band decreases in presence of PANI. During oxidation the stretching vibration of C=C becomes more symmetric and it shows at ~1650 cm$^{-1}$. The bands at 1283 cm$^{-1}$ (assigned as C—N stretching due to the linkage of APS with PVA), 1105 cm-1 (C—O stretching) and 820 cm-1 (C—S stretching) are for PVA-APS gel-based electrolyte. Two main peaks at around 1450 cm$^{-1}$ and 1283 cm$^{-1}$ occur for C—C and C—N stretching modes, their shapes differ along with intensity ratio being opposite in presence of PANI. Broadening of these bands usually occur due to differentiation of their bond order. In addition, the expanded intensities of C—O and C—S stretching of PANI composite gel electrolyte in comparison to the other materials are apparent which also verifies the interaction of PANI with PVA and APS materials.

For further investigation, Raman spectra were taken for all similar systems to understand the interaction between PVA and PANI. The band at 1080 cm$^{-1}$ of PVA is assigned as O—H bond deformation. In presence of HCl, line broadening occurs possibly for cross linking of PVA, which shifts towards lower wavenumber with disappearing nature to support oxidation by APS. On the other hand, in presence of PANI, it shifts to higher wavenumber, 1130 cm$^{-1}$ along with the development of three characteristic bands due to the stretching of (i) C—N+. (ii) imine (iii) and partially charged imine groups. The band for C—N+. appears at around 1330 cm$^{-1}$ with splitting pattern having peaks at 1320 and 1340 cm$^{-1}$ which are possibly for polaron and bipolaron effects. The stretching vibration of C—O of PVA after interaction with PANI may also contribute to this 1340 cm$^{-1}$ band. The Raman spectrum of PVA shows a band at around 1360 cm$^{-1}$ which appears at lower wavenumber, 1340 cm-1 for interaction with PANI. The contribution of benzenoid and quinoid structures of PANI was studied by Raman spectra (FIG. 1C). Band shift (a mixed mode of the C=N and CH=CH stretching vibrations) due to the quinoid structure appears around 1485-1471 cm$^{-1}$. In addition, other band shifts at 1150, 950, 870 due to C—H in-plane bending and C—N—C of the benzene ring are related to both polaronic and bipolaronic structures in the PANI in the presence of HCl and PVA.

To study the electrical properties, a layer of the PVA-PANI gel (thickness=~270 μm) was sandwiched between two glassy carbon (GC) electrodes with an area of 25×25 mm$^2$. The cell was then tested via the cyclic voltammetry (CV) and electrochemical impedance spectroscopy (EIS) methods. The redox peaks in the CV result (FIG. 1D) and nature complex impedance (FIG. 1E) show that the PANI composite gel electrolyte has a charge storage property like a pseudocapacitor. The magnitude of the capacitance was estimated from the CV data to be 38.6 mF, which is two orders of magnitude higher than the estimated double layer capacitance in a device with non-porous electrodes and surface area of 25×25 mm2. While the glassy carbon is not a redox active material and the storage capacitance in a gel without the conducting polymer is negligible, the symmetric redox peaks in the CV loop suggest a pseudocapacitive charge storage mechanism in the bulk gel electrolyte due to the presence of PANI. Considering the mass of the gel, the specific capacitance (Cgel) of the composite gel has been calculated to be 428.9 mF g−1. The mechanism of charge storage in the volume of the gel can be explained through the change in the oxidation state of PANI (inset FIG. 1D) between leucoemeraldine salt (LS) and ES by removing/ adding electron and proton (H+) pairs in a reversible redox reaction:

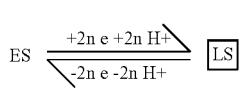 (1)

The reversibility of the reactions and the stability of the gel in a non-sealed device was confirmed after 1000 cycles in the CV with <1% change in the capacitance. Since the conducting polymer is dispersed inside the bulk gel, the occurrence of the redox reaction implies the capability of the composite gel to conduct both electronic and ionic charge. The profile of the Nyquist response from the EIS result (FIG. 1E) confirms this feature by showing a pure constant phase element response that can be modeled as distributed elemental capacitances and resistors in the bulk gel (FIG. 1F). In this model, each monomer mimics a capacitor, C, that can be charged or discharged by receiving/donating an electron-H+ pair. Rion and Rele represent the elemental resistors for ionic and electronic charge transport through the composite gel, respectively.

Since one expects the formation of double layer charges at the interfaces between the gel and the electrodes, two capacitors (Cdl1 and Cdl2) are considered in the model. The resistance of the electrodes is also shown as series resistors Rs1 and Rs2. Due to the distributed capacitors in the volume of the gel, when a voltage is applied across the gel layer, a progressive charging process is expected by pumping positive and negative charges from the electrodes until all the elemental capacitances are charged.

Figures 2A, 2B, 2C:
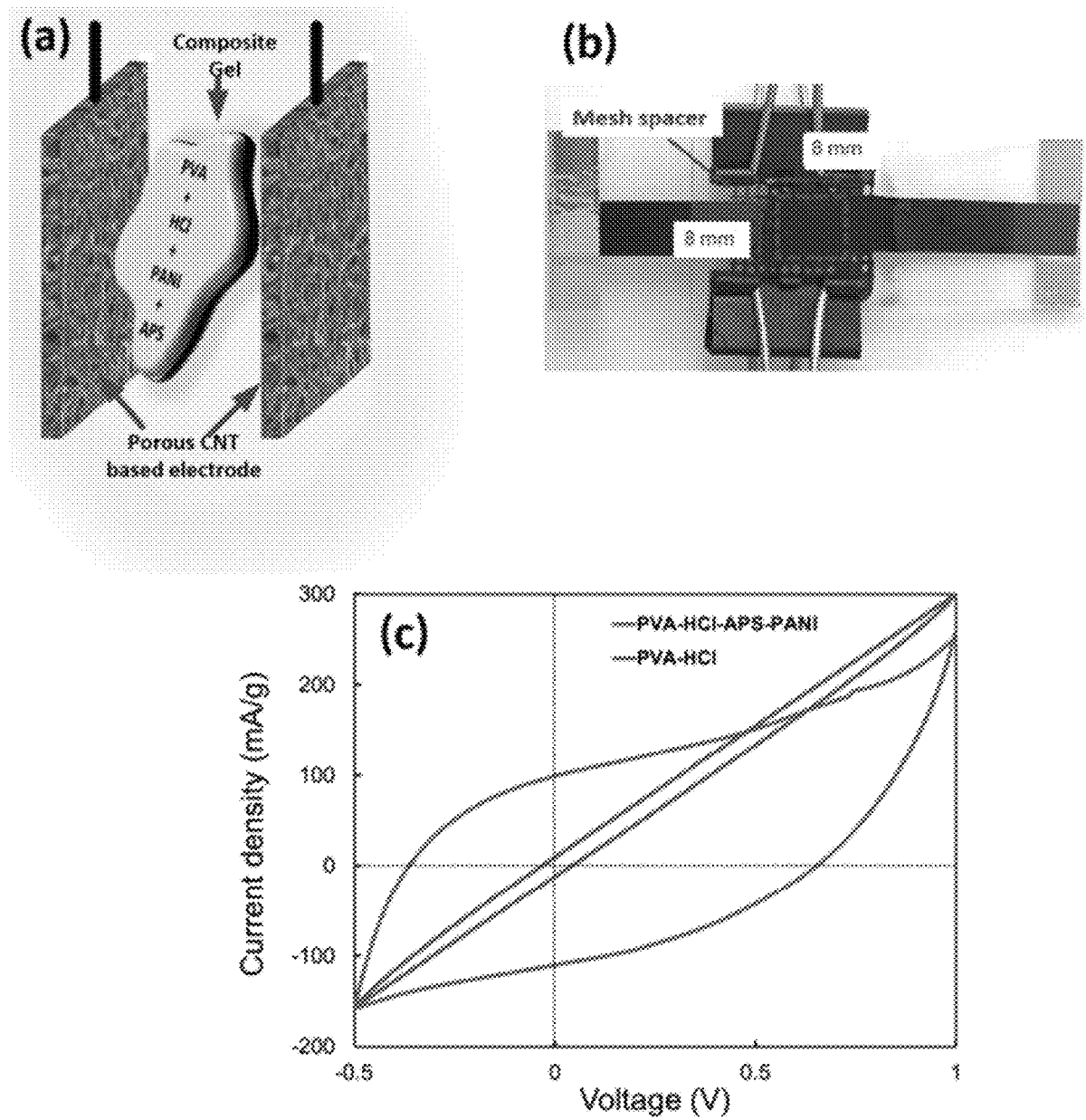
FIGS. 2A, 2B, and 2C show (a) a schematic diagram; (b) a picture of the fabricated supercapacitor with CNT based porous electrodes and a thin layer of the composite gel as the electrolyte and active redox material; and (c) CV results from devices with two different gels: PVA-HCI and PVA-HCI-APS-PANI.

Recognizing this unique capability of storing charge in the PANI composite gel, a simple supercapacitor device was fabricated with two carbon nanotubes (CNTs) based porous electrodes and the PANI based composite gel as the electrolyte. FIGS. 2A and 2B show a schematic and a picture of the supercapacitor with the gel layer thickness of ~270 μm. In FIG. 2C, the CV result from the device with the PVA-HCl-APS-PANI gel electrolyte is compared with that in a similar device with an acidic gel of PVA-HCl. The results clearly show the advantage in employing both ionic and electronic conductivity in the composite gel to store charges in the volume of the electrolyte as well as at the double layers. The absence of the redox peaks in the CV result from the PANI composite gel implies domination of the storage via the double layer charges due to the high porosity of the electrodes. Supercapacitor devices with gel electrolytes with and without the conducting polymer was further studied via the EIS and galvanostatic charging methods. Specifically, the galvanostatic test showed an equivalent series resistance (ESR) of ~83Ω. Considering the poor conductivity of the CNT electrodes, application of more conductive electrodes with current collectors would reduce ESR significantly.

The overall capacitance of the device with the PANI-based gel was estimated from the CV result to be 48 mF which corresponds to 3.33 Fg−1 (specific capacitance) based on the mass of CNTs on the electrodes. The specific capacitance can be significantly increased by optimizing the electrode material and structure. For instance, much higher capacitances can be achieved by using composite redox active materials with graphene, conducting polymers, and molybdenum disulfide for the electrodes. With the mechanism of charge storage inside the gel volume, potentially, devices can be fabricated with higher energy and power densities than conventional devices without this feature. The concept of using small-molecule based redox active materials in the electrolyte of a device for partial charge storage has been reported before. In the composite gel, PANI is acting as the redox material and the hydrogenation/dehydrogenation of PVA adds to the storage capacity of the bulk gel. Considering the low cost of the gel material and simplicity in device fabrication, the PANI composite gel is potentially suitable for fabricating high capacitances, low cost, and flexible supercapacitors.

The UV-vis study of the PANI composite gel (FIG. 1A) showed light absorption by PANI. Therefore, the feasibility of harvesting solar energy by the composite gel was studied in a DSSC-like device. As shown in FIGS. 3A and 3B, the gel was placed between two electrodes: a TiO2 coated FTO (fluorine doped tin oxide) as the anode and a Pt-coated FTO as the cathode. In this configuration, dye material was not used, and the gel acted both as the electrolyte and photoactive layer in which PANI (ES form) was the photoactive material and PVA mesh with ions served as the electrolyte. The current-voltage characteristics of the device were measured both under dark and under simulated sunlight conditions. The J-V characteristics in FIG. 3C clearly show the generated power under illumination. From the results, the device was found to have an open circuit voltage (VOC) of 0.48 V and a short circuit current density (JSC) of 0.12 mA·cm-2. However, the fill factor and overall conversion efficiency were relatively low compared to conventional DSSCs with a separate layer of dye materials and liquid electrolytes. This can be further addressed by adding dye materials to the gel.

Since the composite gel demonstrated both energy storage and solar energy harvesting capabilities, we designed and tested a hybrid device for concurrent harvesting and storage in a single two-terminal device (i.e., photoactive supercapacitor). The hybrid device was made as before with a single layer of the gel between two electrodes: a FTO-TiO$_2$ and a porous CNT-based electrode (FIGS. 4A and 4B).

Figures 4A, 4B, 4C, 4D, 4E:
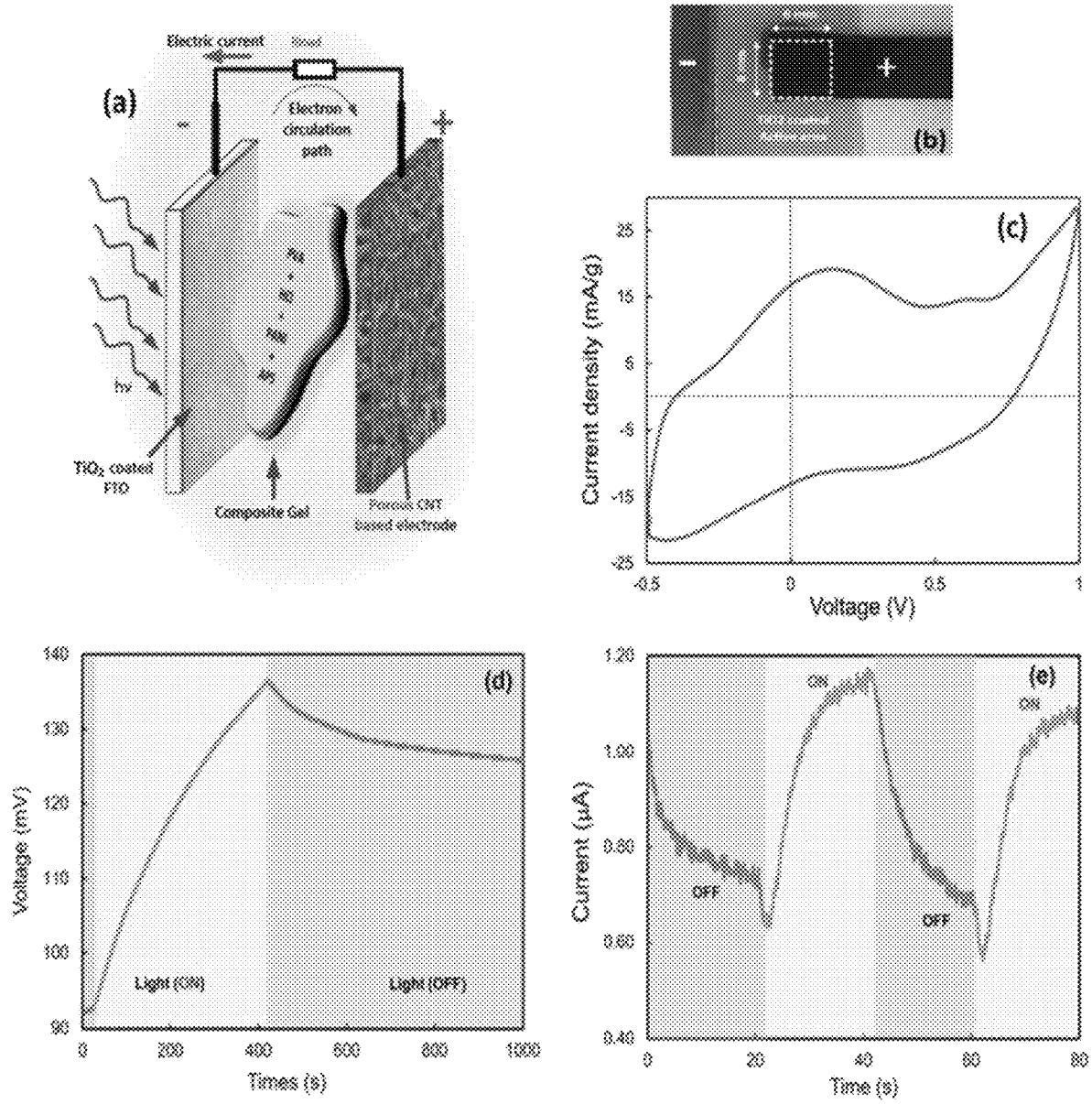
FIGS. 4A, 4B, 4C, 4D, and 4E show (a) a schematic diagram; (b) a picture of the hybrid photoactive supercapacitor for energy harvesting and storage; (c) CV of the hybrid device; (d) open circuit voltage; and (e) short circuit current versus time under light and dark pulses.

FIG. 4C shows the CV measurements under dark conditions. The loop verifies the internal storage capacity. A part of this storage effect is due to the double charges at the electrode electrolyte interfaces. However, the redox peaks imply additional charge storage in a pseudocapacitive form, occurring inside the volume of the composite gel electrolyte due to the existence of PANI and PVA. From the electrical response of the cell in the dark (FIG. 4C), the specific capacitance of the cell was calculated to be 1.53 Fg$^{-1}$. Additional characterization of the photoactive supercapacitor through the galvanostatic test showed an equivalent series resistance (ESR) of ~120Ω.

To study the capability of the device for solar energy harvesting, the open circuit voltage of the cell was monitored under dark and light conditions. As shown in FIG. 4D, the voltage across the cell was increased gradually from 92 mV (dark) to 137 mV in 400 s under light conditions. The gradual voltage change is due to the storage property of the device. The trend in the voltage change suggests that longer illumination time could result in a larger voltage increase before reaching a saturated level when the internal capacitor is fully charged. After cessation of the light, the voltage did not return to its initial dark value. Instead, the slow change in the voltage under dark conditions (i.e. 10 mV drop in 600 s) shows the capability of the gel to retain the charge for a relatively long time. This implies low leakage current in the discharge process.

Additionally, the short circuit current in the cell was studied under alternating 20 s of dark and light pulses (FIG. 4E). The non-zero current in the dark is from the stored charges. However, the current showed an increase of ~0.5 µA when the cell was illuminated by the solar simulator. The low current in the dark is because of the large internal resistance. It should be mentioned that the conventional J-V characteristics do not reflect the full capability of the cell due to the large storage effect and the low photocurrent. Therefore, no attempt was made to measure the efficiency and the fill-factor of the device. The majority of hybrid devices were made by integrating a DSSC with a supercapacitor in one package and sharing one of the electrodes of each cell to make a three-terminal hybrid device. For practical applications, a two terminal hybrid device is potentially more efficient. Almost all reported two terminal hybrid devices have a multilayer structure for the photoactive layer with an electrolyte and a porous counter electrode. The above described single layer device composed of a gel as the photoactive layer, energy storage media, and electrolyte is more promising for the development of low-cost and dry photoactive supercapacitors. Additionally, our preliminary results show that adding a dye material to the composite gel can enhance the energy harvesting in the gel.

Figures 5A, 5B, 5C, 5D, 5E, 5F:
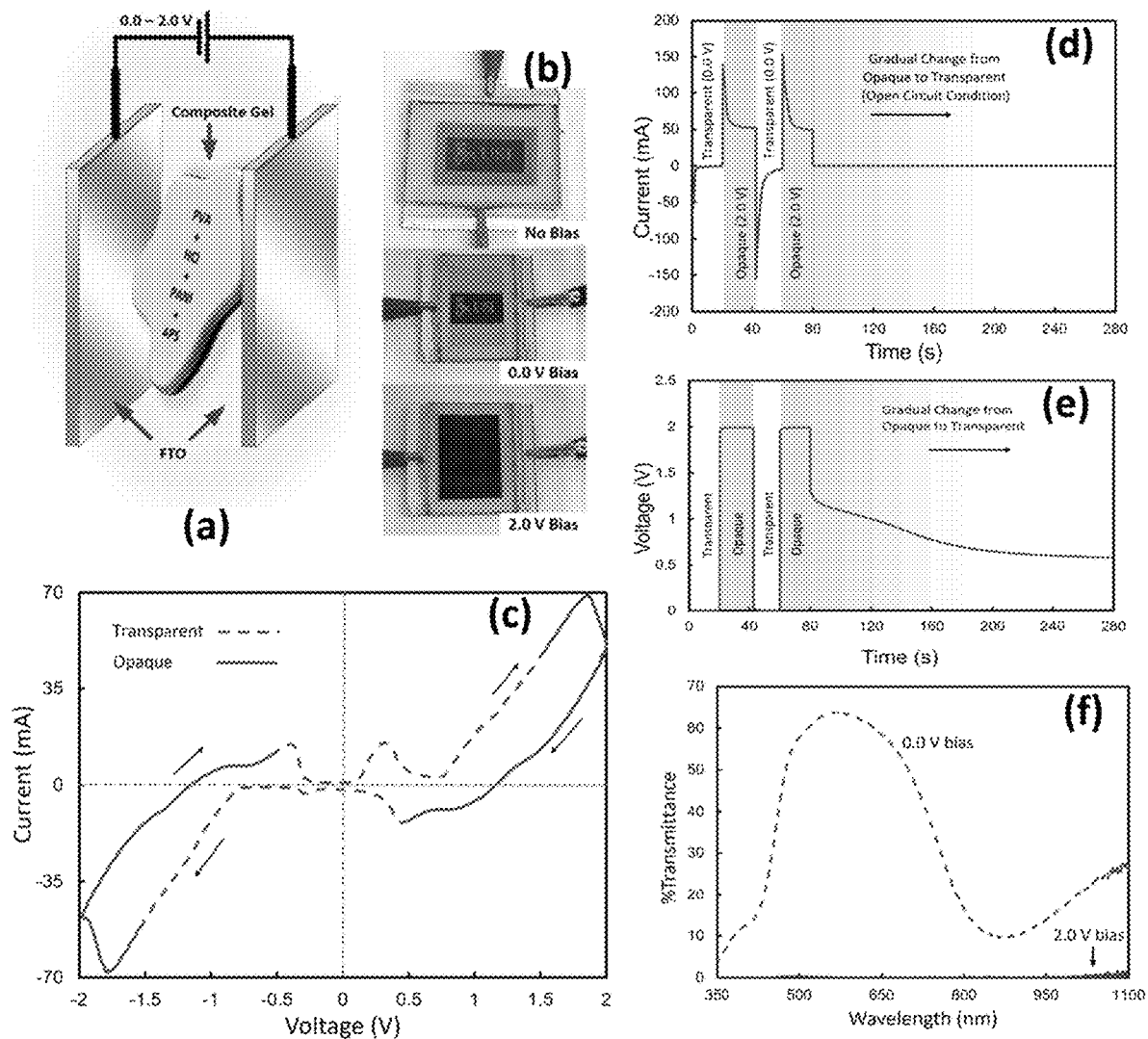
FIGS. 5A, 5B, 5C, 5D, 5E, and 5F show (a) a schematic diagram; (b) pictures of the fabricated electrochromic device at three different modes; (c) CV result showing the redox peaks; (d) electric current through the device in response to (e) the applied voltage pulses; and (f) transmittance of the device in two different biasing conditions.

The synthesized gel was also tested for electrochromic applications by fabricating a device with two FTO electrodes and a single active layer of the PANI composite gel in between (FIG. 5A). As shown in FIG. 5B, the gel was semi-transparent when PANI was in its ES form. The CV study of the cell (FIG. 5C) showed an almost symmetrical response with redox peaks around ±1.5 V and around ±0.38 V. As the voltage of the cell was changing, we noticed that for applied voltages larger than 1.5 V, (|Vapplied|>1.5 V), the color of the gel changed to dark blue. However, when the voltage was scanned to a lower magnitude, the gel became transparent at ~0.5 V. To study the two modes of operation, the voltage was pulsed between 0.0 V and 2.0 V every 20 s. As shown in FIG. 5D, the current through the cell showed a transient response with a steady state current of ~50 mA and 0.0 mA at the dark and transparent modes, respectively. The color change in the sample is clearly seen in FIG. 5B. After applying the last voltage pulse at 2.0 V, the cell was operated under open circuit conditions (FIG. 5E). The gradual voltage change occurred with a slow color change to green, while the color change between the transparent and dark modes under the applied pulses was almost instantaneous. The transparency test results show 64% transmittance around 564 nm at 0.0 V, while the transmittance was almost zero at 2.0 V for the entire range of the spectrum (FIG. 5F).

Figures 6A, 6B, 6C, 6D:
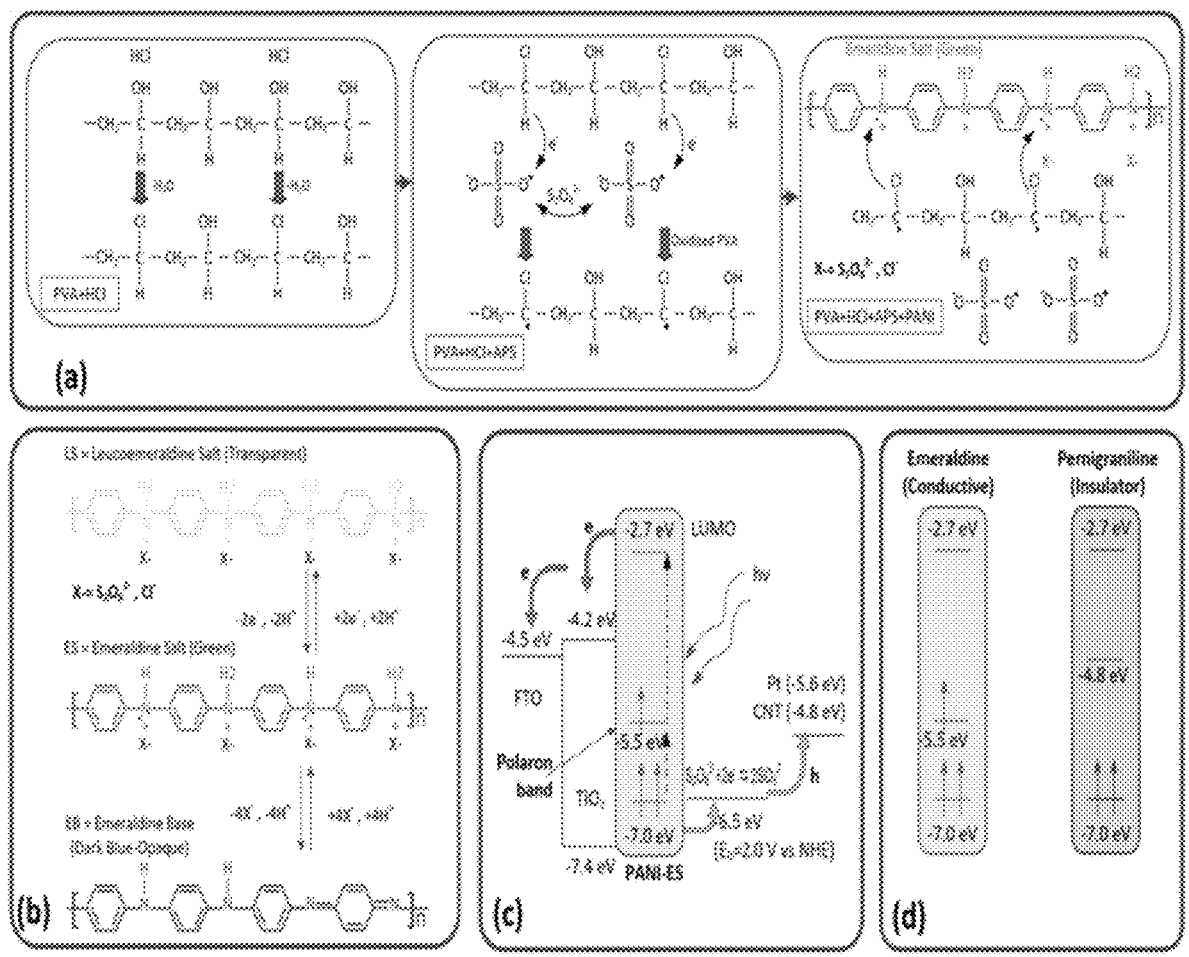
FIGS. 6A, 6B, 6C, and 6D show the steps of fabricating the PANI composite gel: (a) the gelling process of PVA in HCI and the interactions with APS and PANI; (b) chemical reactions in three different oxidation states of PANI; (c) energy level diagram in the electrochemical cell and the hybrid photoactive supercapacitor for energy harvesting. The energy levels are versus the vacuum level. To explain the process, the interaction between PANI and the ionic charges are shown as two different layers; however, that interaction occurs in the bulk gel electrolyte. (d) Loss of electron in emeraldine and conversion to pernigraniline with stored energy in the polymer.

As shown in FIG. 6A, the step-by-step adding chemicals have resulted in the formation of PANI-emeraldine salt (ES) which is green in color. As explained, the mechanism of charge storage in the gel is due to the change in the oxidation state of PANI in the bulk gel. In the supercapacitor device, the oxidation state was changed between ES and LS states by adding or removing electron-proton (H+) pairs. However as shown in FIG. 6B, the oxidation state of PANI can also be changed to emeraldine base (EB) by removing protons (H+) and dedoping the polymer. This process is reversible, and the polymer can get back to the ES form through a protonation process. Transition from LS to ES and then EB under sufficiently large voltages across the gel was confirmed in the electrochromic experiments. Not only the CV result (FIG. 5C) implied the change in the oxidation state, but also the color change was a clear evidence as EB has a dark blue color and LS is fade yellow to transparent in color.

The fact that the oxidation state of the conducting polymer inside the volume of the gel can be changed suggests existence of both ionic and electronic conductions through the gel. In this regard, the composite gel is different than regular gel electrolytes with only ionic charge transport. This unique property of conducting two different types of charges can also explain the observed photovoltaic effect in the bulk gel. The energy diagram of the solar cell and the hybrid photoactive supercapacitor is shown in FIG. 6C. In the composite gel, ES form of PANI absorbs light and generates an excited state. The photogenerated electrons can be transferred to the conduction band of TiO2 and a regeneration process by the ionic mediators (S2O8²⁻+2e⁻↔2SO4²⁻) replace the lost electrons in PANI. In the last step, charge exchange occurs between the mediators and the cathode (i.e., Pt or CNT-based electrode). The detail reactions are explained as below:

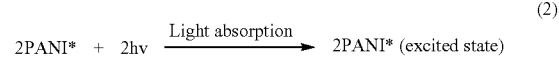

(2)

(3)

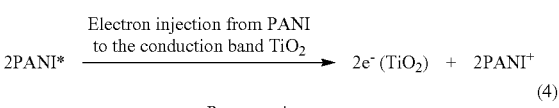

(4)

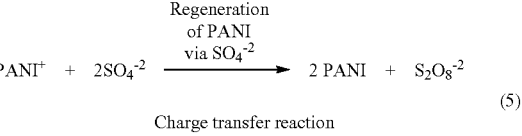

(5)

The device with the Pt cathode responded like a DSSC with a negligible charge storage effect. This can be due to the catalytic property of Pt that facilitates the charge circulation via the mediator for regeneration of PANI into its ES state. However, the weak of catalytic property in CNTs can affect the regeneration process in PANI and convert it to the pernigraniline form after losing the photoexcited electrons and H+ ions (Emeraldine+hv→e-+H++ pernigraniline). Losing a negative (e−) and a positive (H+) charge results in a higher energy mode in PANI which was observed as gradual increase in the open circuit voltage of the hybrid photoactive supercapacitor. The difference in the energy structure of PANI in the Emeraldine and pernigraniline are shown in FIG. 6D.

The change in the oxidation state can also explains the charge stability in the device. Since at the pernigraniline state the electronic conductivity in the polymer is substantially lower than that in the ES form, the recombination rate between electronic and ionic charges would be considerably lower, resulting in a stable form of charge storage in dark as it was observed in FIG. 4D.

Although the results clearly show the feasibility of using the composite gel for fabricating various low-cost devices by simply putting a layer of the gel between two electrodes, the composite can be further customized for different applications. For example, for solar cells or photoactive supercapacitors, a dye material could be added to the gel to enhance the light absorption. This is particularly necessary as PANI in its LS state is semi-transparent. Also, for long operational lifetime of devices appropriate sealing and packaging is required.

CONCLUSION

A facile and low-cost procedure for preparing a new composite material of gel electrolyte is described. The electrical and electrochemical behavior of the composite gel was investigated for application to electrochromic devices, supercapacitors, solar cells, and hybrid photoactive supercapacitors. While all the devices studied in this work are traditionally electrochemical devices, application of the composite gel with both ionic and electronic conductivity between two electrodes demonstrates a different type of cell with a single layer material being active in its entire volume. Potentially, low-cost and more efficient devices can be designed and fabricated by customizing the composite gel by adding other elements such as dyes or nanoparticles. An additional study is needed to explore the impact of materials and concentrations on the energy storage and photovoltaic properties of the devices.

It should be emphasized that the above-described embodiments of the present disclosure are merely possible examples of implementations set forth for a clear understanding of the principles of the disclosure. Many variations and modifications may be made to the above-described embodiment(s) without departing substantially from the spirit and principles of the disclosure. All such modifications and variations are intended to be included herein within the scope of this disclosure and protected by the following claims.

The invention claimed is:

1. A method comprising:
structuring a first material stack by disposing a first material separator layer dimensioned as a first mesh or a first frame on a first electrode layer;
placing a single spatially-stationary layer of a composite gel onto the first material separator layer, wherein the first material separator layer is configured to maintain physical contact between the single spatially-stationary layer of the composite gel and the first electrode layer, wherein the composite gel includes a polyaryl amine, an electrolyte, and an oxidant and has a specific capacitance with a value from about 300 mF/g to about 700 mF/g; and
disposing a second material stack, which contains a second material separator layer dimensioned as a second mesh or a second frame and a second electrode layer, in contact with the single spatially-stationary layer of the composite gel to sandwich the second material separator layer between the single spatially-stationary layer of the composite gel and the second electrode layer while establishing physical contact between the layer of the composite gel and both the second material separator layer and the second electrode layer.

2. The method according to claim 1, comprising forming said composite gel based on a product of a reaction between a hydrolysable polymer and an acid.

3. The method according to claim 2, wherein said forming includes forming said composite gel that includes a photosensitive dye.

4. The method according to claim 2, wherein the hydrolysable polymer comprises any of poly(vinyl alcohol) (PVA), poly (vinyl acetate, poly (vinyl alcohol co-vinyl acetate), poly (methyl methacrylate, poly (vinyl alcohol-co-ethylene ethylene), poly (vinyl butyral-co-vinyl alcohol-co-vinyl acetate), polyvinyl butyral, polyvinyl chloride, and a combination thereof.

5. The method according to claim 2, wherein the hydrolysable polymer has a molecular weight from about 20,000 Da to about 300,000 Da.

6. The method according to claim 2, wherein the hydrolysable polymer is poly(vinyl alcohol) a molecular weight from about 20,000 Da to about 300,000 Da.

7. The method according to claim 1, comprising forming said composite gel as a product of admixing a hydrolysable polymer, an aryl amine, an acid, and an oxidant.

8. The method according to claim 1, comprising forming said composite gel by
(8A) admixing a hydrolysable polymer and acid to produce a first admixture;
(8B) admixing the oxidant with the first admixture to produce a second admixture; and
(8C) admixing the aryl amine with the second admixture.

9. The method according to claim 1, wherein the structuring said first material stack includes forming the first material stack includes at least one of porous carbon, platinum, and $TiO_2$.

10. The method according to claim 1, wherein the structuring said first material stack includes using glass or fluorine-doped tin-oxide glass as part of said first material stack.

11. The method according to claim 1, wherein the placing includes bringing in contact with said composite gel said second electrode that comprises fluorine-doped tin oxide glass with a coating on a surface of said glass, the coating including $TiO_2$ or platinum.

12. The method according to claim 1, wherein said disposing the first material separator layer dimensioned as the first mesh or the first frame on the first electrode layer includes disposing a fiberglass mesh or a parafilm frame on the first electrode layer.

13. The method according to claim 1, wherein the oxidant comprises any of ammonium persulfate, ferric chloride, aluminum nitrate, ammonium dichromate, ammonium peroxydisulphate, barium nitrate, bismuth nitrate, calcium hypoperchlorate, copper (II) nitrate, cupric nitrate, ferric nitrate, hydrogen peroxide, lithium hydroxide monohydrate, magnesium nitrate, magnesium perchlorate, potassium chlorate, potassium dichromate, potassium permanganate, sodium hypochlorite, sodium periodate, zinc nitrate hydrate, nitric acid, sulfuric acid, perchloric acid, ammonium nitrate, silver nitrate, benzoyl peroxide, tetranitromethane, sodium perchlorate, potassium perchlorate, potassium permanganate, potassium persulfate, sodium nitrate, potassium chromate, and a combination thereof.

14. The method according to claim 1, further comprising changing a color of the layer of the composite gel by applying an electrical signal thereto.

* * * * *